United States Patent [19]

Campbell, Jr.

[11] Patent Number: 4,517,551

[45] Date of Patent: May 14, 1985

[54] DIGITAL TO ANALOG CONVERTER CIRCUIT

[75] Inventor: Jules D. Campbell, Jr., Austin, Tex.

[73] Assignee: Motorola, Inc., Schaumburg, Ill.

[21] Appl. No.: 455,390

[22] Filed: Jan. 3, 1983

[51] Int. Cl.³ ........................................... H03K 13/02
[52] U.S. Cl. ............................................. 340/347 DA
[58] Field of Search .................. 340/347 DA, 347 AD

[56] References Cited

U.S. PATENT DOCUMENTS

| 2,889,549 | 6/1959 | Caughey | 340/347 DA |
|---|---|---|---|
| 3,056,085 | 9/1962 | James | 340/347 DA |
| 4,077,035 | 2/1978 | Yee | 340/347 DA |
| 4,126,852 | 11/1978 | Baertsch | 340/347 DA |

*Primary Examiner*—Charles D. Miller

*Attorney, Agent, or Firm*—Anthony J. Sarli, Jr.; Jeffrey Van Myers; Robert Lee King

[57] ABSTRACT

A digital to analog converter which provides positive and negative analog output signals in response to a digital input number is disclosed. The input number has n bits including a sign bit and $n-1$ magnitude bits, where n is an integer. An input receives the $n-1$ magnitude bits and is coupled to switches for selectively coupling a predetermined reference voltage to a capacitance portion comprising a rank ordered plurality of capacitors. First and second charges related to first and second portions of said $n-1$ magnitude bits, respectively, are sequentially integrated with respect to time by an integrator which is selectively coupled to the capacitance portion to provide an analog output signal. A buffer output amplifier selectively samples and holds the analog output signal.

13 Claims, 2 Drawing Figures

4,517,551

DIGITAL TO ANALOG CONVERTER CIRCUIT

Technical Field

This invention relates generally to digital to analog conversion circuits and, more particularly, to a circuit for converting digital data having one of two polarities to an analog voltage.

BACKGROUND ART

In performing a digital to analog conversion utilizing switched capacitors, a discontinuity which is typically referred to as offset error may occur when transitioning between positive and negative numbers. Offset errors are caused, in part, from voltage errors associated with a digital to analog converter (DAC) structure. Such offset errors are very undesirable for DACs utilized in speech applications because offset error may introduce harmonic frequencies that drastically affect the quality of sound. Other errors associated with a DAC structure, such as gain and nonlinearity errors, are not as critical in speech applications and may be compensated otherwise. However, a DAC structure which is insensitive to voltage errors resulting from parasitic capacitances is also very desirable. Typical capacitive digital to analog circuits utilize a structure having the disadvantage of using many capacitors which are weighted commonly as much as two hundred and fifty-six units to one unit. In such applications, capacitive matching errors are a common problem. In an attempt to reduce the number of capacitors, others have used what is commonly known as a "dividing capacitor" which is a capacitor connected in series between two groups of parallel connected capacitors to effectively reduce or divide the total capacitance. A "dividing" capacitor however adds an additional capacitor to the total number of capacitors and increases circuit size. Typical bipolarity digital to analog circuit structures also require an additional capacitor for converting the sign bit by a conventional method such as offset binary.

SUMMARY OF THE INVENTION

Accordingly, an object of the present invention is to provide an improved digital to analog converter.

Another object of the invention is to provide an improved bipolarity digital to analog converter having substantially no discontinuity when transitioning between negative and positive numbers.

Yet another object of the invention is to provide a digital to analog converter having a structure which is insensitive to parasitic capacitance errors and which minimizes circuit area.

In carrying out the above and other objects, there is provided, in one form, a digital to analog converter for providing an analog output signal corresponding to a digital input number of either positive or negative polarity having n bits including a sign bit and n−1 magnitude bits, where n is an integer. An input portion receives the digital input number. A capacitive portion comprising a rank ordered plurality of capacitors is coupled to the input portion. The capacitors have selectively interconnected first electrodes and interconnected second electrodes, for developing a first electrical charge proportional to a first portion of the n−1 magnitude bits and for developing a second electrical charge proportional to a second portion of the n−1 magnitude bits. A reference voltage portion provides a predetermined reference voltage to the selectively interconnected first electrodes, and a charge sequence control portion selectively charges and discharges the capacitors to provide the first and second electrical charges. An integrator portion is coupled to the capacitance portion to provide the analog output signal.

The above and other objects, features and advantages of the present invention will be more clearly understood from the following detailed description taken in conjunction with the accompanying drawings.

DESCRIPTION OF THE PREFERRED EMBODIMENT

Figure 1:
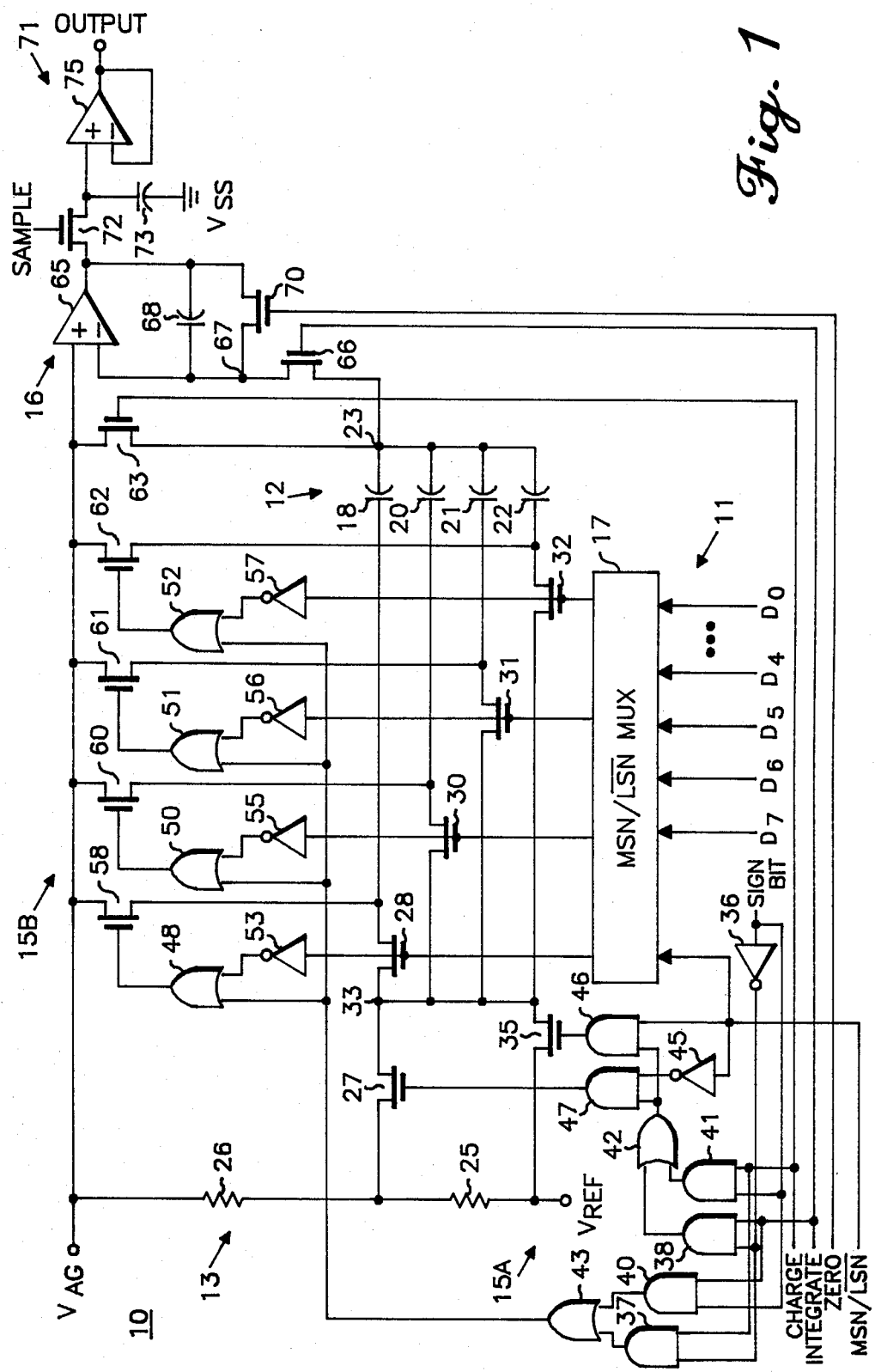
FIG. 1 illustrates in logic diagram form a digital to analog converter circuit constructed in accordance with a preferred embodiment of the present invention.

Shown in FIG. 1 is a digital to analog converter 10 generally comprising an input portion 11, a capacitance portion 12, a reference voltage portion 13, a charge sequence control portion 15 having sections 15a and 15b and an integrator portion 16. In a preferred form, an output portion 71 is coupled to integrator portion 16. It should be well understood that although in a preferred embodiment converter 10 is fabricated from MOS devices of one conductivity type, converter 10 may also be fabricated by using numerous other processes.

Input portion 11 comprises a most significant nibble/least significant nibble complement (MSN/$\overline{\text{LSN}}$) multiplexer 17 for receiving a digital input number having n−1 magnitude bits, $D_0$, $D_1$, $D_2$, $D_3$, $D_4$, $D_5$, $D_6$ and $D_7$, where n is an integer. In a preferred form, n is equal to nine. Since a nibble refers to four bits, the least significant nibble (LSN) comprises data bits $D_0$, $D_1$, $D_2$ and $D_3$. The most significant nibble (MSN) comprises data bits $D_4$, $D_5$, $D_6$ and $D_7$. A most significant nibble/least significant nibble complement (MSN/$\overline{\text{LSN}}$) mode signal is coupled to a select-control input of multiplexer 17.

Capacitance portion 12 comprises a rank ordered plurality of capacitors having capacitors 18, 20, 21 and 22. Capacitor 22 is weighted one unit, capacitor 21 is weighted two units, capacitor 20 is weighted four units and capacitor 18 is weighted eight units. Although all capacitors are binarily weighted, other weights may be assigned. Capacitors 18, 20, 21 and 22 each have a first electrode thereof interconnected at a charge transfer node 23.

Reference voltage portion 13 in a preferred form comprises a resistive voltage source having weighted resistors. A resistor 25 has a first terminal coupled to a known reference voltage potential $V_{REF}$ which in the preferred form is a negative supply voltage, $V_{SS}$. A second terminal of resistor 25 is coupled to a first terminal of a resistor 26. A second terminal of resistor 26 is coupled to an analog ground voltage, $V_{AG}$, which is equal to $\frac{1}{2}(V_{DD}-V_{SS})$ where $V_{DD}$ is a known positive supply voltage. Resistor 26 is weighted one unit and resistor 25 is weighted fifteen units. A first voltage reference select switch 27 has a first terminal coupled to the second terminal of resistor 25, and a second terminal coupled to first terminals of charge switches 28, 30, 31 and 32 at a reference voltage node 33. A second voltage reference select switch 35 has a first terminal coupled to voltage $V_{REF}$ and a second terminal coupled to reference voltage node 33. A second terminal of charge switch 28 is connected to a second electrode of capacitor 18. A second terminal of charge switch 30 is connected to a second electrode of capacitor 20. A second terminal of charge switch 31 is coupled to a second electrode of capacitor 21, and a second terminal of charge switch 32 is coupled to a second electrode of capacitor 22.

Charge sequence control portion 15a comprises an inverter 36 having an input coupled to a sign bit of the digital input number. An output of inverter 36 is coupled to a first input of both AND gates 37 and 38. A second input of AND gate 37 is coupled to a Charge control logic signal shown in FIG. 2. A second input of AND gate 38 is coupled to both an Integrate Control logic signal shown in FIG. 2 and a first input of an AND gate 40. A second input of AND gate 40 is coupled to both a first input of an AND gate 41 and the sign bit of the digital input number. A second input of AND gate 41 is coupled to the Charge control logic signal. An output of AND gate 38 is coupled to a first input of an OR gate 42, and an output of AND gate 41 is coupled to a second input of OR gate 42. An output of AND gate 37 is coupled to a first input of an OR gate 43, and an output of AND gate 40 is coupled to a second input of OR gate 43. The MSN/$\overline{\text{LSN}}$ signal is also coupled to an input of an inverter 45 and a first input of an AND gate 46. A second input of AND gate 46 is coupled to both an output of OR gate 42 and a first input of an AND gate 47. An output of inverter 45 is coupled to a second input of AND gate 47. An output of AND gate 46 is coupled to a control electrode of reference select switch 35, and an output of AND gate 47 is coupled to a control electrode of reference select switch 27.

Charge sequence control portion 15b comprises OR gates 48, 50, 51 and 52 which each have a first input coupled to the output of OR gate 43. An inverter 53 has an input coupled to both a control electrode of charge switch 28 and a first output of multiplexer 17. An inverter 55 has an input coupled to both a control electrode of charge switch 30 and a second output of multiplexer 17. An inverter 56 has an input coupled to both a control electrode of charge switch 31 and a third output of multiplexer 17. An inverter 57 has an input coupled to both a control electrode of charge switch 32 and a fourth output of multiplexer 17. An output of inverter 53 is coupled to a second input of OR gate 48. An output of inverter 55 is coupled to a second input of OR gate 50. An output of inverter 56 is coupled to a second input of OR gate 51, and an output of inverter 57 is coupled to a second input of OR gate 52. An output of OR gate 48 is coupled to a control electrode of a discharge switch 58, and an output of OR gate 50 is coupled to a control electrode of a discharge switch 60. An output of OR gate 51 is coupled to a control electrode of a discharge switch 61, and an output of OR gate 52 is coupled to a control electrode of a discharge switch 62. A control electrode of a discharge switch 63 is coupled to the Charge control logic signal. A first terminal of discharge switches 58, 60, 61, 62 and 63 is coupled to analog ground $V_{AG}$. A second terminal of discharge switch 58 is coupled to the second electrode of capacitor 18. A second terminal of discharge switch 60 is coupled to the second electrode of capacitor 20. A second terminal of discharge switch 61 is coupled to a second electrode of capacitor 21, and a second terminal of discharge switch 62 is coupled to a second electrode of capacitor 22. A second terminal of discharge switch 63 is coupled to the first electrodes of capacitors 18, 20, 21 and 22 at charge transfer node 23.

Integrator portion 16 comprises an operational amplifier 65 which has a noninverting or positive input coupled to analog ground $V_{AG}$. An inverting or negative input of operational amplifier 65 is coupled to a first terminal of an integrate switch 66 at a summing node 67. A second terminal of integrate switch 66 is coupled to the first electrodes of capacitors 18, 20, 21 and 22 at charge transfer node 23, and a control electrode of integrate switch 66 is coupled to the Integrate Control logic signal. An integrating capacitor 68, which is weighted 20 units in a preferred form, is coupled between the inverting input and an output of operational amplifier 65. An integrate discharge switch 70 is coupled in parallel with integrating capacitor 68 and has a first terminal coupled to the inverting input of operational amplifier 65 at summing node 67 and a second terminal coupled to the output of operational amplifier 65. A control electrode of integrate discharge switch 70 is coupled to a Zero control logic signal shown in FIG. 2.

Although the analog output signal is present at the output of operational amplifier 65, a sample and hold output portion 71 comprising a sample switch 72, a capacitor 73 and an operational amplifier 75 is provided. A first terminal of sample switch 72 is coupled to the output of operational amplifier 65, and a second terminal of sample switch 72 is coupled to both a first electrode of capacitor 73 and a noninverting input of operational amplifier 75. Sample switch 72 is made conductive by a Sample control logic signal shown in FIG. 2 applied to its control electrode. An inverting input of operational amplifier 75 is coupled to an output thereof so that operational amplifier 75 is connected in a unity gain configuration. The output of operational amplifier 75 provides the analog output signal from digital to analog converter 10.

Figure 2:
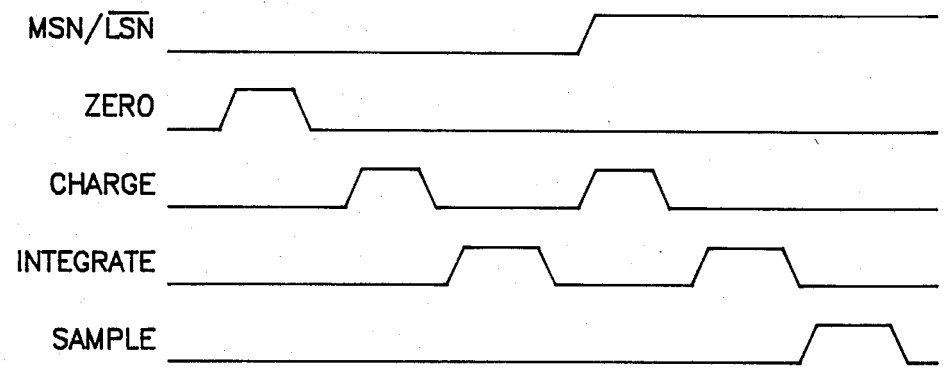
FIG. 2 illustrates in graphical form selected logic control signals associated with the circuit of FIG. 1.

In operation, for each conversion of a digital input number, there are two charge and integrate cycles for each sampled converted output signal regardless of the polarity of the input number. Shown in FIG. 2 are logic signals associated with the circuit of FIG. 1 illustrating a single conversion of the digital input number. Initially, the Zero control logic signal resets the output of integrator portion 16 by discharging integrating capacitor 68. The MSN/$\overline{\text{LSN}}$ signal controls the sequence of conversion of digital bits. As shown, the least significant nibble is converted firstly and then the most significant nibble is converted although the order of conversion may be reversed depending upon design preference. The Charge and Integrate control logic signals are sequenced so that first and second charges corresponding to the least significant nibble and most significant nibble, respectively, are transferred to integrator portion 16. The sum of the first and second charges are integrated and sampled during the presence of the Sample control logic signal. The circuit operation previously described occurs every time a digital input number is converted regardless of the polarity of the digital input number as determined by the sign bit. The sign bit of the digital input number affects the circuit operation by controlling charge portion 15 which determines the initial charge associated with capacitance portion 12.

Initially, assume that the digital input number has a positive sign bit of logic one level conventionally indicating that the digital input number is negative. After capacitor 68 is discharged by integrate discharge switch 70 in response to the Zero Control logic signal, the Charge control logic signal transitions to a high logic level. It can readily be shown that when both the Charge control logic signal and sign bit are a logic one and MSN/$\overline{\text{LSN}}$ is a logic zero, that charge sequence section 15a causes reference select switch 35 to be nonconductive and reference select switch 27 to be conductive. This couples a reference voltage of $(1/16)$ $V_{REF}$ or in the preferred form $(1/16)$ $(V_{SS}-V_{AG})$ to reference node 33. The digital input number has $n-1$ magnitude bits $D_0$–$D_7$ where n is nine. Bits $D_0$–$D_7$ are coupled to respective input terminals of multiplexer 17. The least significant nibble comprising bits $D_0$–$D_3$ are coupled to the four outputs of multiplexer 17 in response to the MSN/$\overline{\text{LSN}}$ signal. In particular, $D_0$ is coupled to the fourth output, $D_1$ is coupled to the third output, $D_2$ is coupled to the second output and $D_3$ is coupled to the first output. Depending upon the logic value of the data bits $D_0$–$D_3$, charge switches 28, 30, 31 and 32 either couple or disconnect the second electrodes of capacitors 18, 20, 21 and 22, respectively, from reference node 33. If any of charge switches 28, 30, 31 and 32 are nonconductive, then section 15b of charge sequence portion 15 functions to couple the second electrode of capacitors 18, 20, 21 or 22 to analog ground, $V_{AG}$, instead of to $(1/16)$ $V_{REF}$. The Charge control logic signal maintains the first electrodes of capacitors 18, 20, 21 and 22 at $V_{AG}$ by means of discharge switch 63. In this manner, for negative digital input numbers, capacitors 18, 20, 21 and 22 are either precharged with a negative polarity charge on the second electrodes thereof and a positive polarity charge on the first electrodes thereof or are kept discharged in response to the least significant nibble of the digital input number. After capacitance portion 12 has been selectively charged, the Charge control logic signal is removed and the Integrate control logic signal is presented to the control electrode of integrate switch 66. During the integrate phase, reference select switches 27 and 35 are nonconductive. The charge from capacitive portion 12 is coupled onto integrating capacitor 68 through integrate switch 66. Since the first electrodes of capacitors 18 and 20–22 are more positive than the second electrodes thereof, the charge is coupled onto capacitor 68 so that summing node 67 is more positive than the output of operational amplifier 65. Therefore, the output of operational amplifier 65 is negative with respect to $V_{AG}$. Charge has been transferred from capacitance portion 12 to integrator portion 16.

In a similar manner, the most significant nibble of the digital input number is coupled to the outputs of multiplexer 17 in response to the MSN/$\overline{\text{LSN}}$ signal transitioning to a high logic state. In particular, bit $D_4$ is coupled to the fourth output, bit $D_5$ is coupled to the third output, bit $D_6$ is coupled to the second output, and bit $D_7$ is coupled to the first output. During the second presence of the Charge control logic signal at a high logic state, reference select switch 35 is now made conductive and reference select switch 27 nonconductive. Therefore, second electrodes of capacitors 18 and 20–22 are coupled to either $V_{REF}$ or $V_{AG}$ in response to the logic value of bits $D_4$–$D_7$, respectively. During the second presence of the Integrate control logic signal, a predetermined charge is again transferred to capacitor 68 to be added with the charge corresponding to the least significant nibble. The circuit operation during the conversion of the most significant nibble is analogous to the conversion of the least significant nibble. After both the first and second charges relating to the least and most significant nibbles have been charged onto integrate capacitor 68, sample and hold output portion 71 is coupled to the integrator 16 at the output of operational amplifier 65 via sample switch 72 in response to the Sample control logic signal. Since capacitance portion 12 and integrate capacitor 68 are subject to charge alteration due to junction leakage of the switches or feed through coupling of the control signals in the switches, output errors may result from the output changing value with respect to time. Sample and hold circuit 71 is used to selectively sample the output of operational amplifier 65 and hold the output for a predetermined amount of time at a constant level.

Assume now, for the purpose of illustration only, that the digital input number has a sign bit of logic level zero conventionally indicating that the digital input number is positive. After capacitor 68 is discharged by integrate discharge switch 70 in response to the Zero control logic signal, the Charge control logic signal again transitions to a high logic level as was the case with the circuit operation for a negative input number. Since the Charge control signal is at a logic one level and both the sign bit and MSN/$\overline{\text{LSN}}$ signal are at a logic zero level, both reference select switch 27 and reference select switch 35 are nonconductive. Therefore, no reference voltage is coupled to reference node 33. Data bits $D_0$–$D_7$ of the input number are again coupled to respective input terminals of multiplexer 17, and the least significant nibble comprising data bits $D_0$–$D_3$ are coupled to the four outputs of multiplexer 17 in response to the MSN/$\overline{\text{LSN}}$ signal. Again $D_0$–$D_3$ are coupled to the fourth through first outputs, respectively. Charge switches 28 and 30–32 respond to data bits $D_3$–$D_0$, respectively, to connect or disconnect the second electrodes of capacitors 18, 20, 21 and 22, respectively, from reference node 33. Section 15b of charge sequence portion 15 couples the analog ground, $V_{AG}$, to the second electrodes of capacitors 18 and 20–22 via discharge switches 58 and 60–62, respectively. Simultaneously, the Charge control logic signal causes discharge switch 63 to be conductive and couple analog ground $V_{AG}$ to the first electrodes of capacitors 18 and 20–22. Therefore, during the presence of the Charge control logic signal in a high logic state, capacitors 18 and 20–22 are discharged. After the Charge control logic signal transitions to a low logic level and the Integrate control logic signal transitions to a high logic level, reference select switch 27 becomes conductive to couple a reference voltage of $(1/16)$ $V_{AG}$ to reference node 33. Switches 28 and 30–32 selectively couple the reference voltage to predetermined second electrodes of capacitors 18 and 20–22, respectively, in response to the logic value of the least significant nibble of the digital input number. Simultaneously, integrate switch 66 is conductive and couples integrator portion 16 to capacitance portion 12. The capacitors of capacitance portion 12 which have the second electrode thereof coupled to reference node 33 withdraw charge from integrator portion 16 and become charged. Since charge flows from integrator portion 16 to capacitance portion 12, the electrode of capacitor 68 which is coupled to the summing node 67 is more negative than the electrode of capacitor 68 which is coupled to the output of operational amplifier 65. Similarly, reference node 33 is negative with respect to charge transfer node 23. Therefore, the output of operational amplifier 65 is a positive output with respect to $V_{AG}$. After the Integrate control logic signal transitions to a low logic level and both the MSN/$\overline{\text{LSN}}$ and Charge control logic signals transition to a high logic level, multiplexer 17 couples the most significant nibble having bits $D_4$-$D_7$ to switches 32, 31, 30 and 28, respectively. Discharge switches 58, 60, 61 and 62 couple the second electrodes of capacitors 18, 20, 21 and 22, respectively, to analog ground $V_{AG}$. Simultaneously, discharge switch 63 couples the first electrodes of capacitors 18 and 20-22 to $V_{AG}$ so that capacitors 18 and 20-22 are discharged. When the Charge control logic signal transitions back to a low logic level and the Integrate control logic signal transitions to a high logic level, section 15a of charge sequence portion 15 causes reference select switch 35 to become conductive coupling $V_{REF}$ to reference node 33. Simultaneously, the most significant nibble bits $D_7$, $D_6$, $D_5$ and $D_4$ having a high logic level, if any, couple the second electrodes of capacitors 18 and 20-22, respectively, to reference node 33 and $V_{REF}$. The most significant nibble bits $D_7$, $D_6$, $D_5$ and $D_4$ having a low logic level, if any, cause discharge switches 58 and 60-62 to couple the second electrodes of capacitors 18 and 20-22, respectively, to $V_{AG}$. Again, charge is transferred from integrator portion 16 to capacitance portion 12 to provide a positive output from operational amplifier 65. When the Sample control logic signal transitions to a high logic level, sample and hold output portion 71 is coupled to operational amplifier 65 where the analog output voltage is sampled onto capacitor 73 and held at the output of operational amplifier 75. It should be apparent that the signals of FIG. 2 must be nonoverlapping and are supplied by external circuitry (not shown).

Converter 10 is a bipolar converter for producing both positive and negative analog output voltages about a mid-supply voltage referred to as $V_{AG}$. Significant advantages may be realized by using a mid-supply voltage when converter 10 is implemented in a single conductivity type process. This is because single conductivity processes may not allow greater than one-half the supply voltage to be coupled. Sample switch 72 which utilizes operational amplifier 75 as a driver is the only switch which couples a voltage greater than ($\frac{1}{2}$) $V_{DD}$. Although both positive and negative outputs are generated, with respect to $V_{AG}$, the same polarity of charge is maintained across the capacitors of capacitance portion 12. Further, converter 10 is A.C. coupled to a load to prevent D.C. output errors.

A further design consideration is to make all switches have low leakage. Typically, low leakage switches can not couple voltages near the supply voltage. However, this never becomes a problem with converter 10. Converter 10 is also a parasitic capacitance insensitive structure. Parasitic capacitances associated with charge transfer node 23 do not change the output voltage. Provided no hysteresis exists in capacitors 18 and 20-22, no charge error results because charge transfer node 23 is virtually always returned to voltage $V_{AG}$ which is constant. Parasitic capacitances associated with reference node 33 similarly provide no charge error because the parasitic capacitance is driven from a low impedance reference voltage source through reference select switch 27 or 35.

Capacitance means 12 only comprise four capacitors because the same capacitors are reused for both the most significant and least significant nibble. This avoids scaling and matching problems between numerous capacitors. The largest capacitor of capacitance means 12 is weighted only 8 units because converter 10 allows reference voltage portion 13 to accomplish the scaling. By weighting resistors 25 and 26 in a ratio of 15:1, the proper binary scaling is accomplished between the most significant nibble and least significant nibble by switching the voltage reference. In a preferred form, capacitor 68 is weighted 20 units so that the output of integrator portion 16 is less than the range of $V_{DD}$ to $V_{SS}$ volts. However, the weighting of capacitor 68 is dependent upon the amplitude of $V_{REF}$. By utilizing charge sequence portion 15 to alter the charge/discharge sequence applied to capacitance portion 12 in response to the value of the sign bit, no capacitor is dedicated to the sign bit and an additional bit of resolution is gained.

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true spirit and scope of the invention.

I claim:

1. A digital to analog converter for providing an analog output signal corresponding to a digital input number of either positive or negative polarity, comprising:

input means for receiving said digital input number having n bits including a sign bit and n−1 magnitude bits, where n is an integer, and for coupling either a first portion or a second portion of the n−1 magnitude bits to an output thereof;

capacitance means coupled to said input means comprising a rank ordered plurality of capacitor having selectively interconnected first electrodes and interconnected second electrodes, for developing a first electrical charge thereon proportional to the first portion of said n−1 magnitude bits and a second electrical charge thereon proportional to the second portion of said n−1 magnitude bits;

reference voltage means for providing a predetermined reference voltage;

reference voltage switching means coupled to both the reference voltage means and the output of the input means, for selectively coupling the reference voltage means to selective first electrodes of the capacitance means in response to the digital input number;

charge sequence control means coupled to the output of the input means, to said capacitance means and to said reference voltage means, for selectively charging and discharging said rank ordered plurality of capacitors in response to the polarity of said digital input number; and integration means coupled to the interconnected second electrodes of said capacitance means, for translating both the first and second electrical charge across said capacitance means into said analog output signal.

2. The digital to analog converter of claim 1 wherein the first electrodes of said rank ordered plurality of capacitors are selectively interconnected via charge switching means comprising a rank ordered plurality of switches, each of which has a first terminal coupled to a predetermined first electrode of said rank ordered plurality of capacitors and a second terminal coupled to said reference voltage means.

3. The digital to analog converter of claim 1 wherein said rank ordered plurality of capacitors comprise (n−1)/2 capacitors, where n−1 is an even numbered integer.

4. The digital to analog converter of claim 3 wherein said rank ordered plurality of capacitors are binarily weighted.

5. The digital to analog converter of claim 1 wherein said reference voltage means is a resistive voltage divider.

6. The digital to analog converter of claim 5 wherein said resistive voltage divider comprises:
a first weighted resistor having a first terminal coupled to a first node for receiving a predetermined voltage potential, and a second terminal which is selectively coupled to the selectively interconnected first electrodes of said capacitance means; and
a second weighted resistor having a first terminal coupled to the second terminal of said first weighted resistor, and a second terminal coupled to a second node for receiving a second predetermined voltage.

7. The digital to analog converter of claim 6 wherein said first weighted resistor is weighted to a value of one unit and said second weighted resistor is weighted to a value of fifteen units.

8. A digital to analog converter for providing an analog output signal corresponding to a digital input number of either positive or negative polarity, comprising:
input means for receiving said digital input number having n bits including a sign bit and n−1 magnitude bits, where n is an integer;
capacitance means coupled to said input means comprising a rank ordered plurality of capacitors having selectively interconnected first electrodes and interconnected second electrodes, for developing a first electrical charge thereon proportional to a first portion of said n−1 magnitude bits and a second charge thereon proportional to a second portion of said n−1 magnitude bits;
reference voltage means for providing a predetermined reference voltage;
reference voltage switching means coupled to the reference voltage means and the capacitance means, for selectively coupling the reference voltage to selective first electrodes of the capacitance means in response to the digital input number;
first charge sequence logic means coupled to said reference voltage switching means, for selectively sequentially coupling predetermined first electrodes of said capacitance means in response to said input number to a first and a second voltage terminal having predetermined voltage potentials;
second charge sequence logic means coupled to both said first charge sequence logic means and said input means, for selectively coupling the remainder of said first electrodes, if any, in response to said input number to a third voltage terminal of predetermined voltage potential; and
integration means coupled to the interconnected second electrodes of said capacitance means, for translating both the first and second electrical charges across said capacitance means into said analog output signal.

9. A method of providing an analog output signal of either positive or negative polarity corresponding to a digital input number having n bits including a sign bit and n−1 magnitude bits, where n is an integer, comprising the steps of:
coupling said n−1 magnitude bits to an input means;
discharging a rank ordered plurality of capacitors;
coupling a first group of said n−1 magnitude bits from said input means to control means;
coupling a first group of the plurality of capacitors to a first reference voltage while maintaining all other capacitors discharged in response to the first group of said n−1 magnitude bits, thereby charging the first group of capacitors;
summing the charge stored on the first group of capacitors to provide a first charge and integrating said first charge with respect to time to translate the first charge into a first portion of said analog output signal;
coupling a second group of said n−1 magnitude bits from said input means to said control means;
coupling a second group of the plurality of capacitors to a second reference voltage while maintaining all other capacitors discharged in response to the second group of said n−1 magnitude bits, thereby charging the second group of capacitors;
summing the charge stored on the second group of capacitors to provide a second charge and integrating said second charge with respect to time to translate the second charge into a second portion of said analog output signal; and
adding the first and second portions of said analog output signal to provide said analog output signal.

10. The method of claim 9 further comprising the step of selectively sampling and holding said analog output signal at an output terminal.

11. A digital to analog converter for providing an analog output signal corresponding to a digital input number of either positive or negative polarity, comprising:
a multiplexer for receiving the digital input number having n bits including a sign bit and n−1 magnitude bits, where n is an integer, for providing either a first group of magnitude bits containing the most significant magnitude bits or a second group of magnitude bits containing the remainder of the magnitude bits, in response to a bit conversion control signal;
a binary weighted rank ordered plurality of capacitors having selectively interconnected first electrodes and interconnected second electrodes, for sequentially developing a first charge thereon proportional to the first group of magnitude bits and a second charge thereon proportional to the second group of magnitude bits;
a rank ordered plurality of reference voltage switching means, for selectively coupling the capacitors to a reference voltage node in response to the digital input number;
reference voltage means for providing first, second and third reference voltages;
reference voltage select switching means for sequentially coupling the second and third reference voltages to the selectively coupled capacitors, and for coupling the first reference voltage to the remainder of the capacitors, if any; and
integration means selectively coupled to the interconnected second electrodes of the capacitors, for summing the first and second charges and translating a summed charge into said analog output signal.

12. The digital to analog converter of claim 11 further comprising:
   an output buffer circuit coupled to said integration means for selectively sampling and holding said analog output signal.

13. The digital to analog converter of claim 11 wherein said integration means comprise:
   an operational amplifier having a noninverting input coupled to the first reference voltage, an inverting input selectively coupled to the interconnected second electrodes of the capacitors, and an output;
   an integrating capacitor having a first electrode coupled to the inverting input of the operational amplifier, and a second electrode coupled to the output of the operational amplifier; and
   an integrate discharge switch coupled in parallel with said integrating capacitor, for discharging said integrating capacitor in response to a discharge control signal, thereby zeroing the output of said integration means.

* * * * *